US012652036B2

(12) United States Patent
     Saito

(10) Patent No.:     US 12,652,036 B2
(45) Date of Patent:        Jun. 9, 2026

(54) SEMICONDUCTOR DEVICE

(71) Applicant: FUJI ELECTRIC CO., LTD.,
               Kawasaki (JP)

(72) Inventor:  Isao Saito, Matsumoto-city (JP)

(73) Assignee: FUJI ELECTRIC CO., LTD.,
               Kawasaki (JP)

( * ) Notice:   Subject to any disclaimer, the term of this
                patent is extended or adjusted under 35
                U.S.C. 154(b) by 37 days.

(21) Appl. No.: 18/678,651

(22) Filed:     May 30, 2024

(65)            Prior Publication Data

US 2025/0015792 A1      Jan. 9, 2025

(30)        Foreign Application Priority Data

Jul. 7, 2023    (JP) ................................. 2023-112632

(51) Int. Cl.
     H03K 17/08         (2006.01)
     H03K 17/082        (2006.01)
(52) U.S. Cl.
     CPC .  H03K 17/0822 (2013.01); H03K 2217/0081
                                                (2013.01)
(58) Field of Classification Search
     CPC ................... H03K 17/0822; H03K 2217/0081
     See application file for complete search history.

(56)            References Cited

U.S. PATENT DOCUMENTS

2007/0170978 A1*   7/2007  Furuichi ............ H03K 17/0822
                                                        327/530
2019/0286181 A1    9/2019  Iwamizu et al.
2024/0210982 A1*   6/2024  Wiersch ................. G05F 3/262

FOREIGN PATENT DOCUMENTS

JP          2019-165542 A       9/2019

* cited by examiner

*Primary Examiner* — Daniel C Puentes
(74) *Attorney, Agent, or Firm* — Rabin & Berdo, P.C.

(57)            ABSTRACT

A semiconductor device for operating an inductive load,
including: a switching element having a control terminal, a
low potential terminal and a high potential terminal; a drive
circuit configured to apply a control voltage to the control
terminal of the switching element to switching-drive the
switching element, and operate the inductive load connected
to the switching element; an extracting circuit configured to
extract control terminal charges from the control terminal of
the switching element when the switching element makes a
transition from an on state to an off state; and a voltage
control circuit connected to a connection point between the
low potential terminal of the switching element and the
inductive load, the voltage control circuit being configured
to clamp a drop in a voltage at the connection point to a
predetermined voltage while the extracting circuit is extract-
ing the control terminal charges.

6 Claims, 8 Drawing Sheets

TO GATE SIDE OF
OUTPUT-STAGE
SWITCH M1

SEMICONDUCTOR DEVICE

CROSS-REFERENCE TO RELATED APPLICATION

This application is based upon and claims the benefit of priority of the prior Japanese Patent Application No. 2023-112632, filed on Jul. 7, 2023, the entire contents of which are incorporated herein by reference.

BACKGROUND OF THE INVENTION

1. Field of the Invention

The embodiment discussed herein relates to a semiconductor device.

2. Background of the Related Art

Various electronic devices mounted in vehicles include devices which drive a switching element according to a control signal to operate an inductive load. One-chip semiconductor devices are known as such devices. Such a semiconductor device includes an active clamping circuit to prevent destruction of a device in the semiconductor device at the time of clamping operation of an inductive load.

For example, a technique for setting a clamp voltage which depends on an active clamping circuit to a first clamp voltage at the time of a forward voltage change at an output terminal not being detected and for setting a clamp voltage to a second clamp voltage lower than the first clamp voltage at the time of a forward voltage change at the output terminal being detected was proposed as a related art.
Japanese Laid-open Patent Publication No. 2019-165542

SUMMARY OF THE INVENTION

According to an aspect, there is provided a semiconductor device for operating an inductive load, including: a switching element having a control terminal, a low potential terminal and a high potential terminal, the high potential terminal being configured to receive a positive power supply voltage, the switching element being connected to the inductive load, and being configured to operate in an on state and an off state; a drive circuit configured to apply a control voltage to the control terminal of the switching element to switching-drive the switching element, and operate the inductive load connected to the switching element; an extracting circuit configured to extract control terminal charges from the control terminal of the switching element while the switching element makes a transition from the on state to the off state; and a voltage control circuit connected to a connection point between the low potential terminal of the switching element and the inductive load, the voltage control circuit being configured to clamp a drop in a voltage at the connection point to a predetermined voltage while the extracting circuit is extracting the control terminal charges.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described with reference to the accompanying drawings. Components in the specification and the drawings having virtually the same structure are marked with the same numeral. By doing so, a duplicate description may be omitted.

Figure 1:
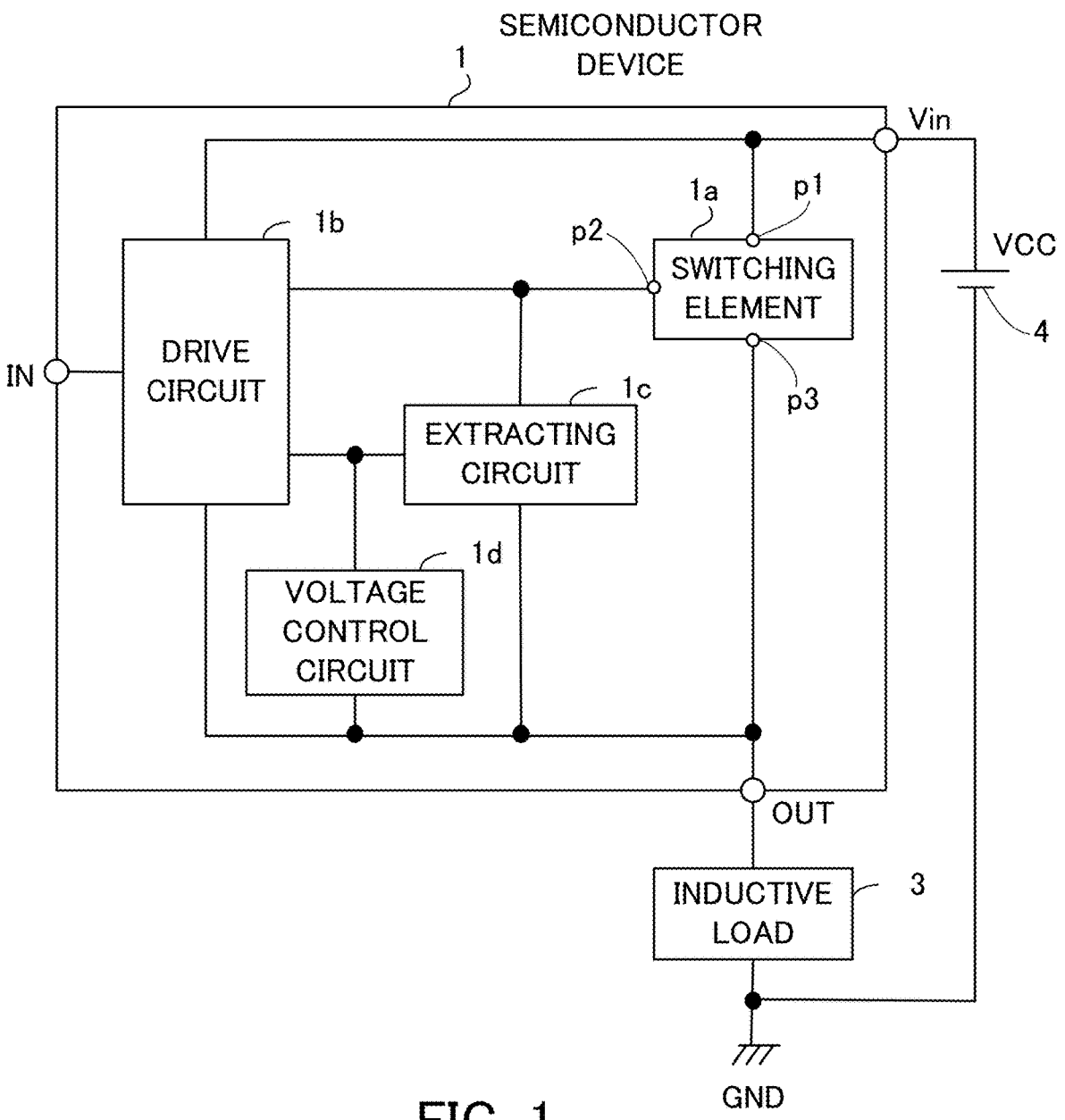
FIG. 1 is a view for describing an example of a semiconductor device.

FIG. 1 is a view for describing an example of a semiconductor device. A semiconductor device 1 includes a switching element 1a, a drive circuit 1b, an extracting circuit 1c, and a voltage control circuit 1d. Furthermore, the semiconductor device 1 includes an output terminal OUT, an input terminal IN, and a power supply terminal Vin. An inductive load 3 is connected to the output terminal OUT. The inductive load 3 is an inductive load, such as a solenoid valve, widely used in an automobile.

A control section (not illustrated), such as an electronic control unit (ECU), is connected to the input terminal IN. A control signal output from the control section is input to the input terminal IN. A power supply section 4 which outputs a power supply voltage VCC is connected to the power supply terminal Vin.

The switching element 1a is a power semiconductor switching element having a high potential terminal p1, a control terminal p2, and a low potential terminal p3 and is a power metal-oxide-semiconductor field-effect transistor (MOSFET), an insulated gate bipolar transistor (IGBT), or the like. Furthermore, a positive electrode end of the power supply section 4 is connected to the high potential terminal p1 of the switching element 1a. If the switching element 1a is a power MOSFET, then the high potential terminal p1, the control terminal p2, and the low potential terminal p3 correspond to a drain, a gate, and a source, respectively, in the structure of the semiconductor device 1.

On the basis of the control signal input via the input terminal IN, the drive circuit 1b applies a control voltage to the control terminal p2 of the switching element 1a to switching-drive the switching element 1a. Furthermore, the drive circuit 1b operates the inductive load 3 connected via the output terminal OUT to the switching element 1a.

If the switching element 1a makes the transition from an on state to an off state, then the extracting circuit 1c extracts charges from the control terminal p2 of the switching element 1a. While the extracting circuit 1c extracts charges from the control terminal p2, the voltage control circuit 1d clamps a drop in voltage at a connection point (corresponding to the output terminal OUT) of the low potential terminal p3 of the switching element 1a and the inductive load 3 at a determined voltage.

By adopting the above structure of the semiconductor device 1, clamp resistance is improved by decreasing clamp voltage. Furthermore, durability for high voltage application is improved.

Before the details of the present disclosure is described, a semiconductor device including an active clamping circuit will now be described with reference to FIGS. 2 through 5. In the following description, the inductive load 3 will be referred to as an L load 3.

Figure 2:
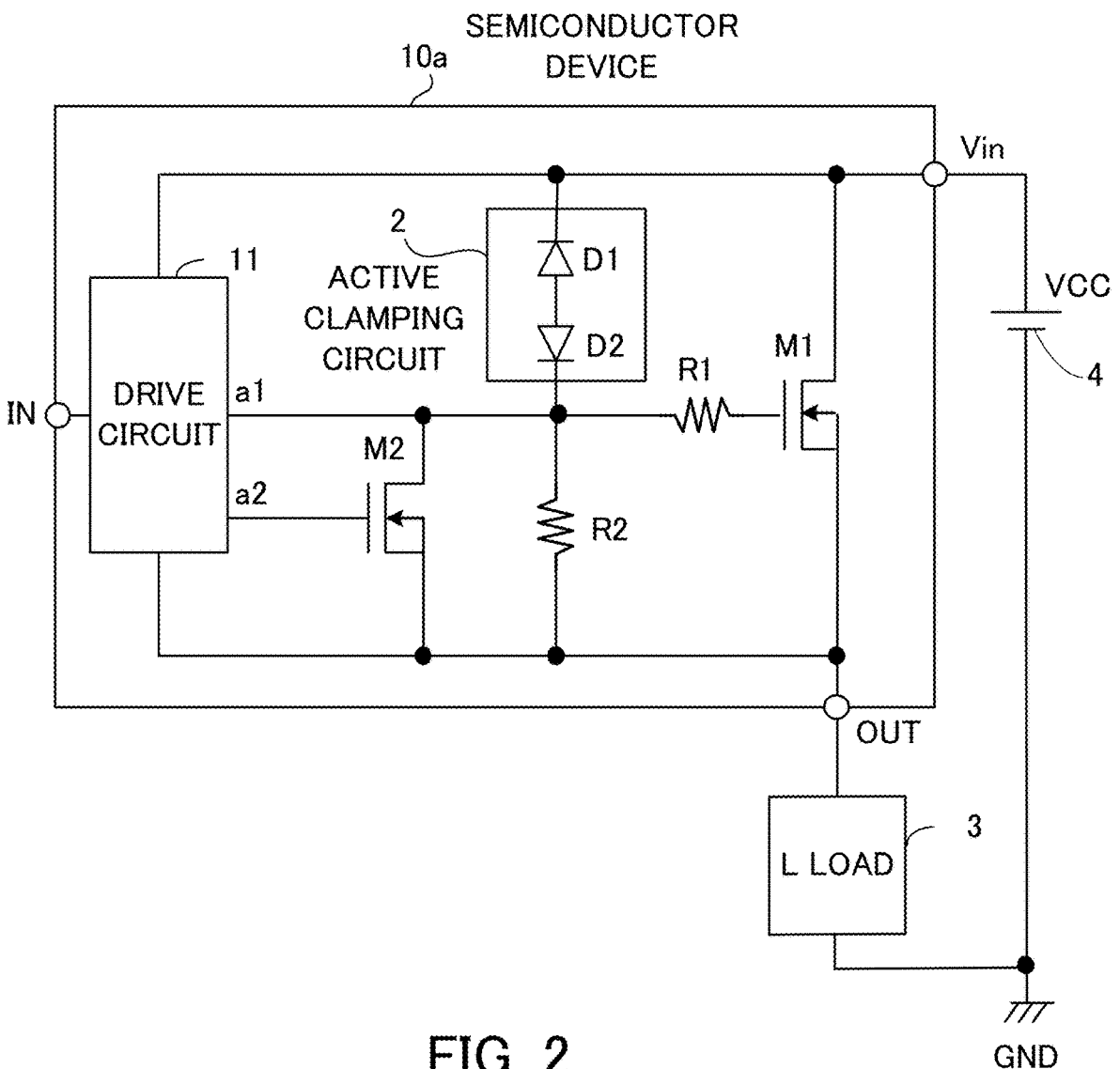
FIG. 2 illustrates an example of the structure of a semiconductor device including an active clamping circuit.

FIG. 2 illustrates an example of the structure of a semiconductor device including an active clamping circuit. A semiconductor device 10a includes an output terminal OUT, an input terminal IN, and a power supply terminal Vin. The L load 3 is connected to the output terminal OUT. A control signal output from an ECU or the like is input to the input terminal IN. A power supply section 4 which outputs, for example, VCC=16 V is connected to the power supply terminal Vin.

The semiconductor device 10a includes a drive circuit 11, an active clamping circuit 2, resistors R1 and R2, an output-stage switch M1, and a gate charge extracting MOS transistor M2. An n-channel MOSFETs (NMOS transistors) are used as the output-stage switch M1 and the gate charge extracting MOS transistor M2.

The active clamping circuit 2 includes diodes D1 and D2. The resistor R1 has the function of a protection resistor. That is to say, the resistor R1 protects the output-stage switch M1 connected in series with the resistor R1 against surge noise, an input of a current larger than an allowable value, or the like. Furthermore, the resistor R2 is a pull-down resistor.

Each element is connected in the following way. The input terminal IN is connected to an input end of the drive circuit 11. The power supply terminal Vin is connected to a positive electrode end of the power supply section 4, a drain of the output-stage switch M1, a cathode of the diode D1, and one power source terminal of the drive circuit 11.

An anode of the diode D1 is connected to an anode of the diode D2. A cathode of the diode D2 is connected to one end of the resistor R1, one end of the resistor R2, a drain of the gate charge extracting MOS transistor M2, and a signal output end a1 of the drive circuit 11. The other end of the resistor R1 is connected to a gate of the output-stage switch M1. A gate of the gate charge extracting MOS transistor M2 is connected to a signal output end a2 of the drive circuit 11.

The output terminal OUT is connected to one end of the L load 3, a source of the output-stage switch M1, the other end of the resistor R2, a source of the gate charge extracting MOS transistor M2, and the other power source terminal of the drive circuit 11. The other end of the L load 3 is connected to a negative electrode end of the power supply section 4 and ground (GND).

When an H-level control signal is input to the input terminal IN, the drive circuit 11 outputs an H-level signal from the signal output end a1 to the gate of the output-stage switch M1 to turn on the output-stage switch M1.

In addition, when an L-level control signal is input to the input terminal IN, the drive circuit 11 outputs an L-level signal from the signal output end a1 to the gate of the output-stage switch M1 to turn off the output-stage switch M1. Under the above switching control by the drive circuit 11, the output-stage switch M1 functions as a switching element for controlling a current flowing through the L load 3.

Furthermore, when the drive circuit 11 turns on the output-stage switch M1, the drive circuit 11 outputs an L-level signal from the signal output end a2 to turn off the gate charge extracting MOS transistor M2. Moreover, if the output-stage switch M1 makes a transition to an off state, then the drive circuit 11 outputs an H-level signal from the signal output end a2 to turn on the gate charge extracting MOS transistor M2.

When the gate charge extracting MOS transistor M2 is turned on, gate charges corresponding to a control voltage of the output-stage switch M1 are extracted via the resistor R1 and the gate of the output-stage switch M1 becomes an L level. This prompts the output-stage switch M1 to turn off.

As stated above, when the output-stage switch M1 is turned off, gate charges are extracted by the gate charge extracting MOS transistor M2. As a result, switching time of the output-stage switch M1 is made shorter than or equal to a determined time and switching loss is suppressed.

On the other hand, if the output-stage switch M1 makes the transition from an on state to an off state, then the active clamping circuit 2 protects the output-stage switch M1 against overvoltage generated due to the inductance of the L load 3.

Figure 3:
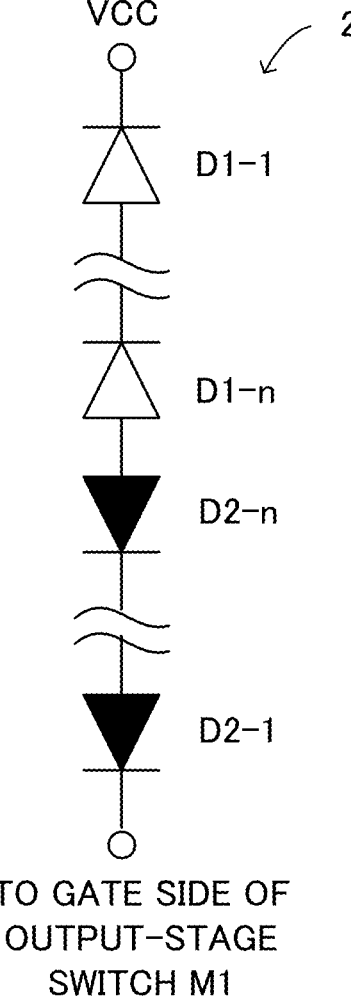
FIG. 3 illustrates an example of the structure of an active clamping circuit.

FIG. 3 illustrates an example of the structure of an active clamping circuit. A diode D1 included in the active clamping circuit 2 may be made up of one or more diffused junction type Zener diodes D1-1, . . . , and D1-n. Furthermore, a diode D2 included in the active clamping circuit 2 may be made up of one or more polycrystalline silicon type Zener diodes D2-1, . . . , and D2-n.

Figure 4:
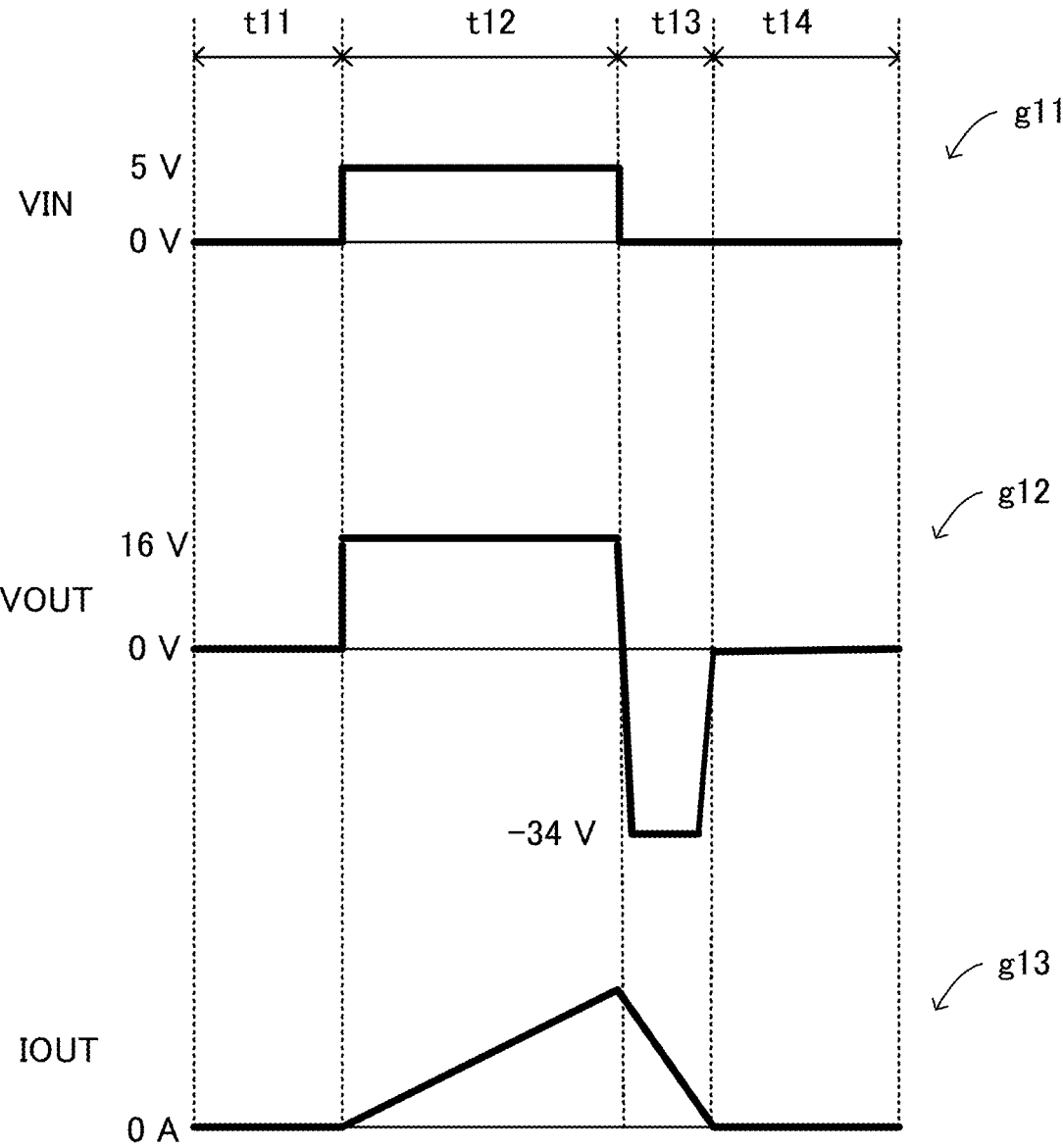
FIG. 4 illustrates an example of an operational waveform of the semiconductor device.

FIG. 4 illustrates an example of an operational waveform of the semiconductor device. FIG. 4 illustrates an operational waveform of the above semiconductor device 10a obtained at the time of a voltage across the L load 3 being cramped. A waveform g11 is the waveform of a control signal VIN at the input terminal IN.

A waveform g12 is the waveform of a voltage VOUT at the output terminal OUT. A waveform g13 is the waveform of a current IOUT flowing from the output-stage switch M1, through the output terminal OUT, to the L load 3.

(Period t11) When the semiconductor device 10a is started, the control signal VIN becomes an L level. At this time, the gate of the output-stage switch M1 becomes an L level. Accordingly, the output-stage switch M1 turns off. Furthermore, the source of the output-stage switch M1 is connected to the output terminal OUT and the output-stage switch M1 turns off. As a result, the voltage VOUT is 0 V. In addition, because the output-stage switch M1 turns off, the current IOUT does not flow and is 0 A.

(Period t12) The control signal VIN becomes an H level (5 V, for example). At this time, the gate of the output-stage switch M1 becomes an H level. Accordingly, the output-stage switch M1 turns on. Because the output-stage switch M1 turns on, the current IOUT flows from the output terminal OUT to the L load 3 and increases. In addition, it is assumed that the power supply voltage VCC of the power supply section 4 is 16 V. Because the output-stage switch M1 turns on, the voltage VOUT rises to 16 V.

(Period t13) The control signal VIN becomes an L level. At this time, the gate of the output-stage switch M1 becomes an L level and the output-stage switch M1 turns off. Accordingly, the current IOUT flowing from the output terminal OUT to the L load 3 takes a direction in which it is cut off. As a result, the current IOUT decreases.

On the other hand, the L load 3 is connected to the output terminal OUT. When the output-stage switch M1 makes the transition from an on state to an off state to cut off the flow of the current IOUT, a current flowing through the L load 3 attempts to maintain the flow. As a result, back electromotive force is generated in the L load 3 in a direction in which the current IOUT flows.

Accordingly, the voltage VOUT drops. For example, if a peak of a potential differential during period t13 between the power supply terminal Vin and the output terminal OUT is 50 V and the power supply voltage VCC of the power supply section 4 is 16 V, then the voltage VOUT drops to −34 V. A voltage between VCC and OUT at this time is a clamp voltage.

When during period t13, the breakdown voltage of the diode D1 included in the active clamping circuit 2 is exceeded and the diode D1 breaks down, the current IOUT flows in the reverse direction, that is to say, from the cathode to anode of the diode D1. Furthermore, if at this time, a voltage applied between the gate and the source of the output-stage switch M1 becomes higher than or equal to a threshold voltage of the output-stage switch M1, then the output-stage switch M1 turns on and the current IOUT flows through the output-stage switch M1 to the output terminal OUT.

In addition, a remaining current IOUT which does not flow in the direction of the output-stage switch M1 flows through the diode D2 and the resistor R2 to the output terminal OUT. By exercising the above control, energy stored in the inductance of the L load 3 at the time of a voltage across the L load 3 being clamped is handled (surge current at the time of a voltage across the L load 3 being clamped is handled).

(Period t14) After handling energy stored in the inductance of the L load 3 ends, the same operation that is performed during period t11 is performed.

As has been described, when the control signal VIN becomes an H level, the output-stage switch M1 goes into an on state and a current flows through the L load 3. When the output-stage switch M1 is in an off state, the voltage VOUT drops to a negative value due to back electromotive force generated in the L load 3.

When the breakdown voltage of the diode D1 inserted between the drain and the gate of the output-stage switch M1 is exceeded, a current flows into the gate of the output-stage switch M1 and the output-stage switch M1 is put into an on state. Furthermore, a current flows through the pull-down resistor R2. As a result, energy stored in the L load 3 is handled.

Figure 5:
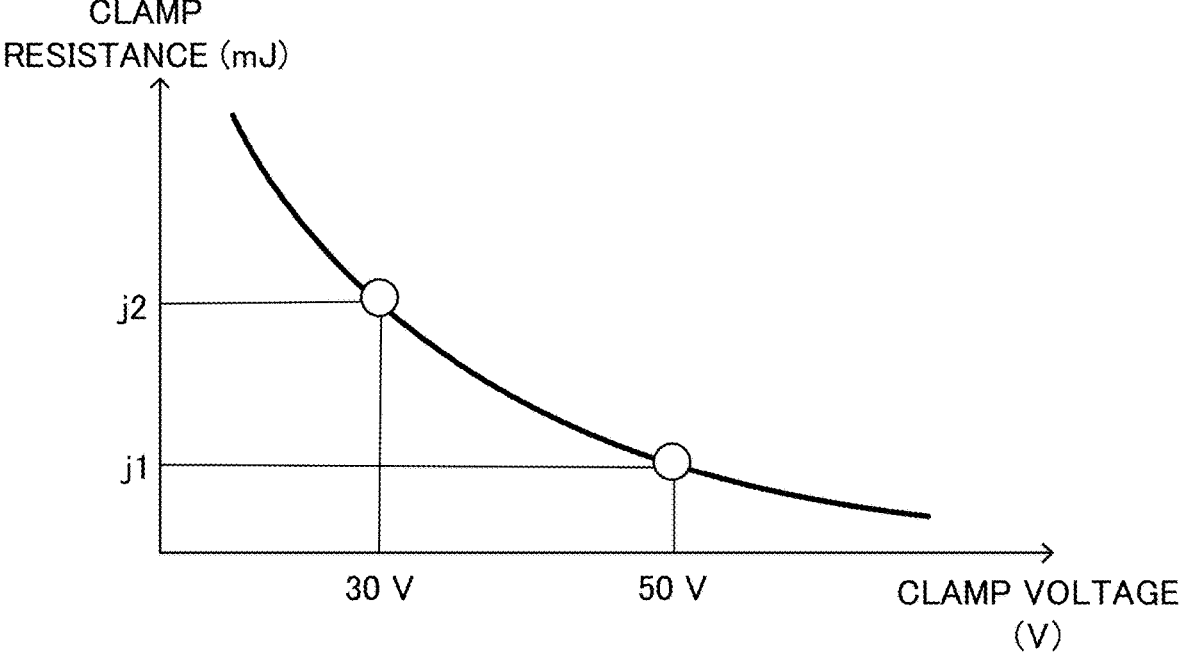
FIG. 5 illustrates the relationship between clamp voltage and clamp resistance.

FIG. 5 illustrates the relationship between clamp voltage and clamp resistance. In FIG. 5, a vertical axis indicates clamp resistance (mJ) and a horizontal axis indicates clamp voltage (V). Clamp resistance j1 at the time of clamp voltage=50 V is lower than clamp resistance j2 at the time of clamp voltage=30 V.

If a clamp voltage is 50 V, then time taken to handle energy stored in the L load 3 is short compared with a case where a clamp voltage is 30 V. However, if energy handling is performed in a short period of time, then the output-stage switch M1 generates much heat and clamp resistance is low compared with a case where a clamp voltage is 30 V. As a result, destruction of the element tends to occur.

As stated above, clamp resistance depends on a clamp voltage. Accordingly, if a clamp voltage is made as low as possible, then clamp resistance is improved. On the other hand, if a clamp voltage is made low, it is difficult to form an active clamping circuit which resists high voltage application. The present disclosure has been made in view of this problem. An object of the present disclosure is to provide a semiconductor device in which clamp resistance is improved by decreasing a clamp voltage and in which durability for high voltage application is improved.

Figure 6:
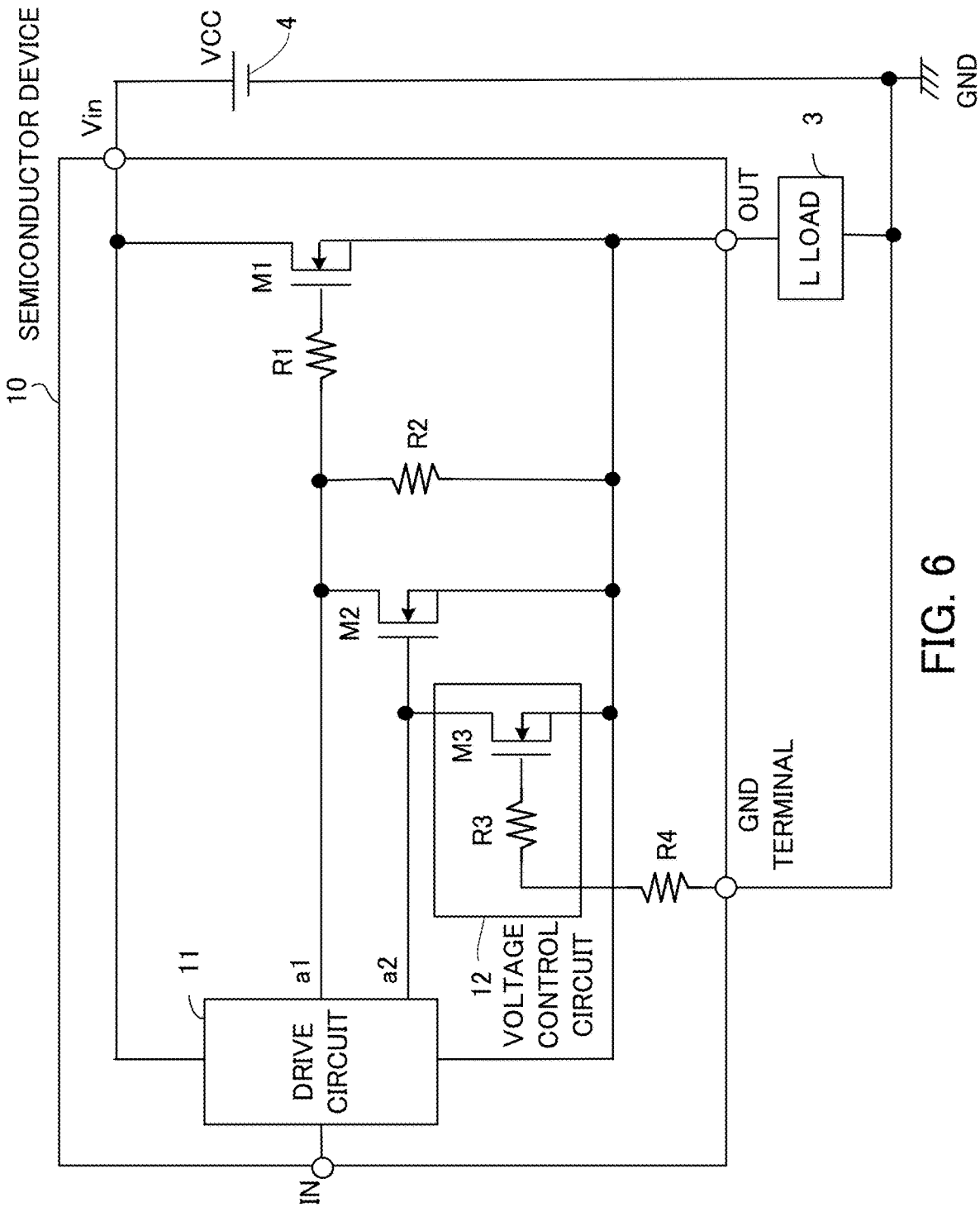
FIG. 6 illustrates an example of the structure of a semiconductor device.

A semiconductor device according to an embodiment will now be described in detail. FIG. 6 illustrates an example of the structure of a semiconductor device. For example, a semiconductor device 10 according to an embodiment exercises control on a high side in a power module such as an intelligent power switch (IPS). The semiconductor device 10 includes an output terminal OUT, an input terminal IN, a power supply terminal Vin, and a ground (GND) terminal. An L load 3 is connected to the output terminal OUT. A control signal is input to the input terminal IN. A power supply section 4 having, for example, power supply voltage VCC=16 V is connected to the power supply terminal Vin.

The semiconductor device 10 includes a drive circuit 11, a voltage control circuit 12, resistors R1 and R2, an output-stage switch M1 (switching element), a gate charge extracting MOS transistor M2 (first MOS transistor), and a ground (GND) resistor R4.

The voltage control circuit 12 includes a resistor R3 and a voltage-controlled MOS transistor M3 (second MOS transistor). The voltage-controlled MOS transistor M3 has the function of a source follower. That is to say, an output voltage follows up an input voltage. Furthermore, the resistor R3 has the function of a protection resistor. That is to say, the resistor R3 protects the voltage-controlled MOS transistor M3 connected in series with the resistor R3 against surge noise, an input of a current larger than an allowable value, or the like.

An NMOS transistor (first NMOS transistor) is used as the gate charge extracting MOS transistor M2 and an NMOS transistor (second NMOS transistor) is used as the voltage-controlled MOS transistor M3. The semiconductor device 10 differs from the semiconductor device 10a illustrated in FIG. 2 in that it does not include the active clamping circuit 2 and in that it includes the voltage control circuit 12.

Each element is connected in the following way. The input terminal IN is connected to an input end of the drive circuit 11. The power supply terminal Vin is connected to a positive electrode end of the power supply section 4, a drain of the output-stage switch M1, and one power source terminal of the drive circuit 11. One end of the resistor R1 is connected to one end of the resistor R2, a drain of the gate charge extracting MOS transistor M2, and a signal output end a1 of the drive circuit 11.

The other end of the resistor R1 is connected to a gate of the output-stage switch M1. A gate of the gate charge extracting MOS transistor M2 is connected to a drain of the voltage-controlled MOS transistor M3 and a signal output end a2 of the drive circuit 11.

The output terminal OUT is connected to one end of the L load 3, a source of the output-stage switch M1, the other end of the resistor R2, a source of the gate charge extracting MOS transistor M2, a source of the voltage-controlled MOS transistor M3, and the other power source terminal of the drive circuit 11. One end of the resistor R3 is connected to a gate of the voltage-controlled MOS transistor M3. The other end of the resistor R3 is connected to one end of the ground resistor R4. The other end of the ground resistor R4 is connected to the GND terminal. The GND terminal is connected to the other end of the L load 3, a negative electrode end of the power supply section 4, and GND (reference potential).

Figure 7:
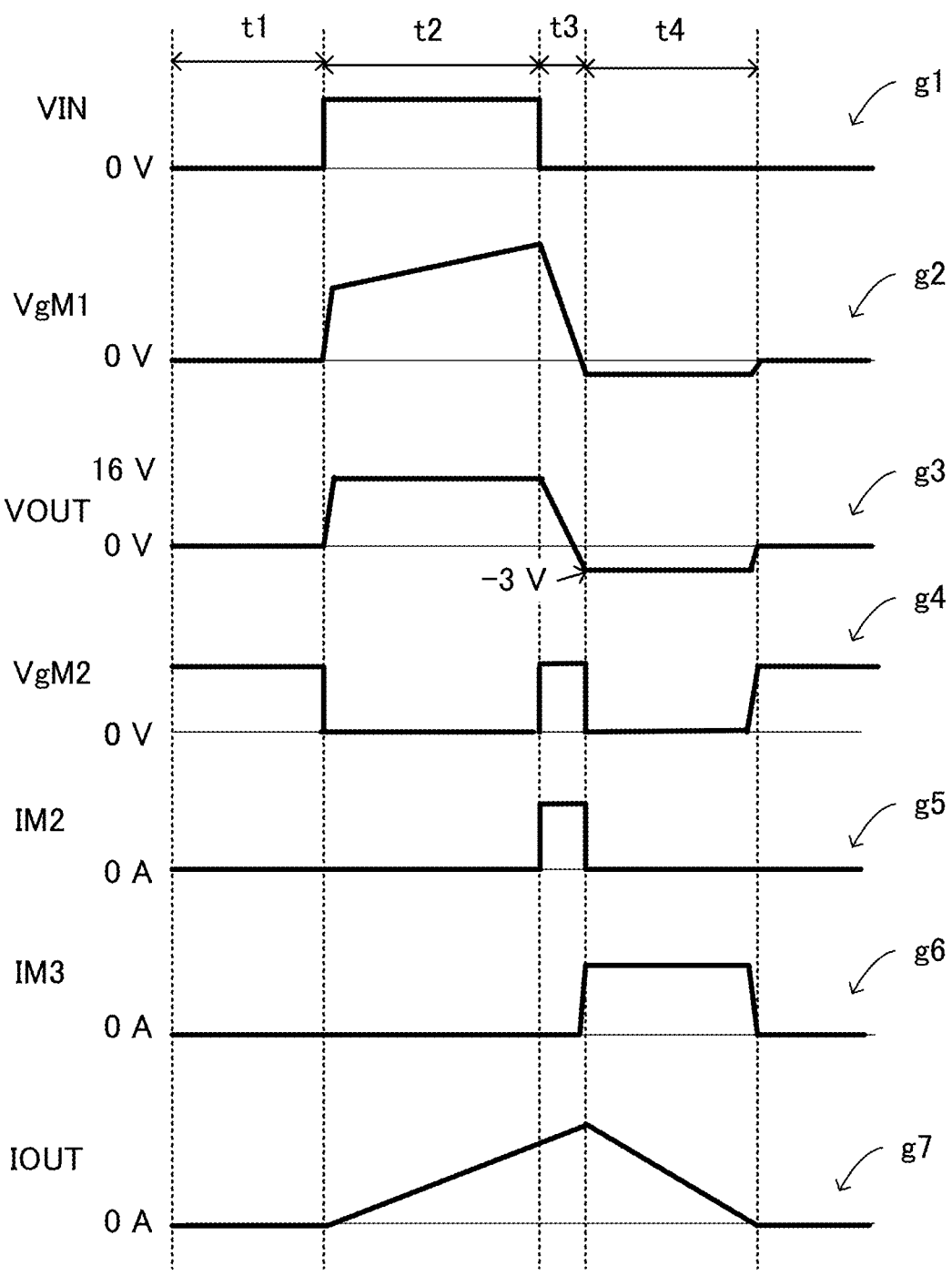
FIG. 7 illustrates an example of an operational waveform of the semiconductor device.

FIG. 7 illustrates an example of an operational waveform of the semiconductor device. FIG. 7 illustrates an operational waveform of the above semiconductor device 10 obtained at the time of a voltage across the L load 3 being cramped. A waveform g1 is the waveform of a control signal VIN at the input terminal IN. A waveform g2 is the waveform of a gate voltage VgM1 of the output-stage switch M1.

A waveform g3 is the waveform of a voltage VOUT at the output terminal OUT. A waveform g4 is the waveform of a gate voltage VgM2 of the gate charge extracting MOS transistor M2.

A waveform g5 is the waveform of a current IM2 flowing from the drain to the source of the gate charge extracting MOS transistor M2. A waveform g6 is the waveform of a current IM3 flowing from the drain to the source of the voltage-controlled MOS transistor M3. A waveform g7 is the waveform of a current IOUT flowing from the output-stage switch M1, through the output terminal OUT, to the L load 3.

(Period t1) When the semiconductor device 10 is started, the control signal VIN becomes an L level. At this time, the gate voltage VgM1 of the output-stage switch M1 becomes an L level. Accordingly, the output-stage switch M1 turns off. The source of the output-stage switch M1 is connected to the output terminal OUT and the output-stage switch M1 turns off. As a result, the voltage VOUT is 0 V.

Furthermore, if the gate voltage VgM1 is 0 V, then the gate charge extracting MOS transistor M2 turns on. However, the current IM2 does not flow when the semiconductor device 10 is started. Because the voltage-controlled MOS transistor M3 is in an off state, the current IM3 does not flow. Because the output-stage switch M1 turns off, the current IOUT does not flow and is 0 A.

(Period t2) The control signal VIN becomes an H level (5 V, for example). At this time, the gate voltage VgM1 of the output-stage switch M1 rises and the output-stage switch M1 turns on. Furthermore, it is assumed that the power supply voltage VCC of the power supply section 4 is 16 V. Because the output-stage switch M1 turns on, the voltage VOUT is 16 V.

In addition, if the gate voltage VgM1 rises, then the gate voltage VgM2 becomes an L level, the gate charge extracting MOS transistor M2 turns off, and extracting gate charges of the output-stage switch M1 is stopped. Because the voltage-controlled MOS transistor M3 is in an off state, the current IM3 does not flow. Moreover, because the output-stage switch M1 turns on, the current IOUT flows from the output terminal OUT to the L load 3 and increases.

(Period t3) The control signal VIN becomes an L level. The gate voltage VgM1 of the output-stage switch M1 drops and the output-stage switch M1 begins to turn off. The output-stage switch M1 makes the transition from an on state to an off state.

At this time, the gate voltage VgM2 becomes an H level, the gate charge extracting MOS transistor M2 turns on, and gate charges are extracted via the gate charge extracting MOS transistor M2. As a result, the voltage VOUT drops. Furthermore, because the gate charge extracting MOS transistor M2 turns on and extracts gate charges, the current IM2 flows. Because the voltage-controlled MOS transistor M3 is in an off state, the current IM3 does not flow.

(Period t4) It is assumed that a threshold voltage of the voltage-controlled MOS transistor M3 is Vth. When the voltage VOUT becomes lower than or equal to a voltage differential (GND-Vth) between GND and the threshold voltage Vth in a clamp operation state of a voltage across the L load 3, the voltage-controlled MOS transistor M3 turns on.

Furthermore, the gate charge extracting MOS transistor M2 turns off and extracting gate charges is stopped. Alternatively, an on state of the gate charge extracting MOS transistor M2 is slightly maintained and the amount of gate charges extracted is minimized. Because gate charges are extracted via the resistor R2, an extracting speed drops.

In addition, when the voltage-controlled MOS transistor M3 turns on, a drop in the voltage VOUT at the output terminal OUT is clamped at the voltage differential (GND–Vth) and stops. That is to say, the voltage VOUT is determined by a source follower of the voltage-controlled MOS transistor M3 and is clamped at the voltage differential (GND–Vth). Accordingly, a clamp voltage is –Vth (=GND–Vth) and is –3 V in the example of FIG. 7. After period t4 ends, the same operation that is performed during period t1 is performed.

Figure 8:
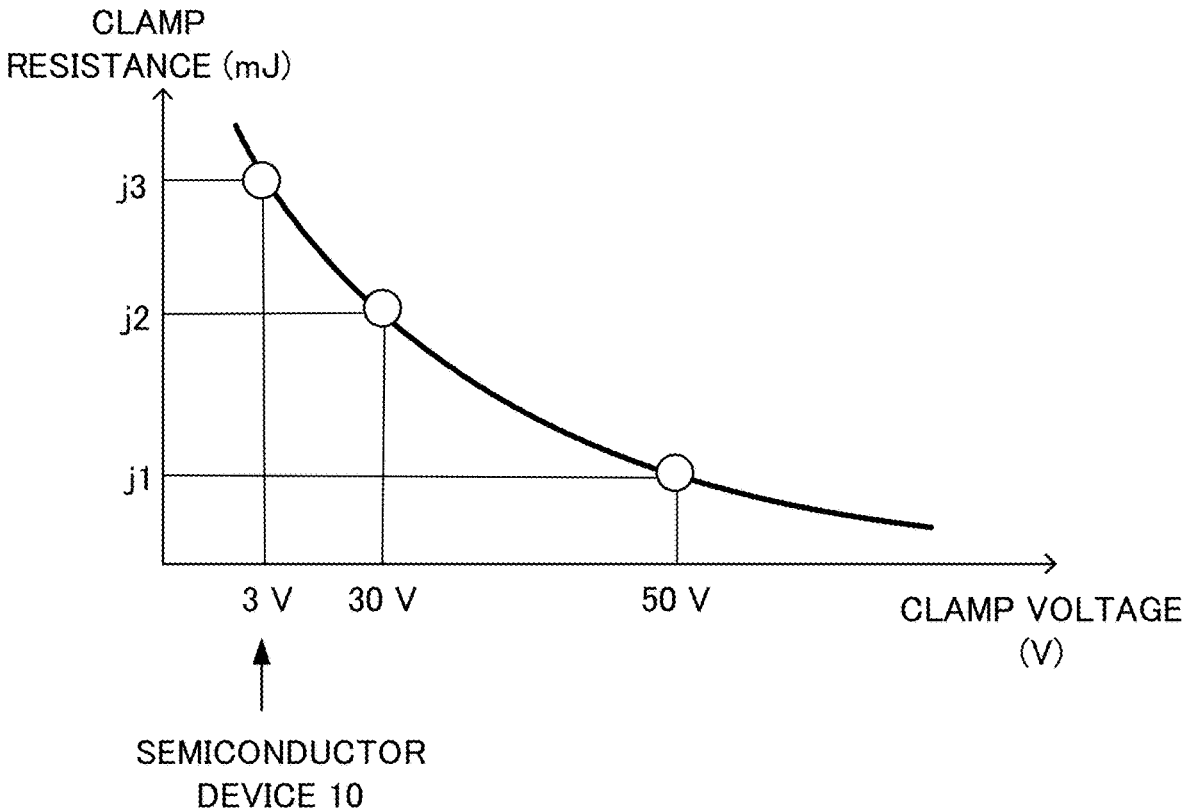
FIG. 8 illustrates the relationship between clamp voltage and clamp resistance.

FIG. 8 illustrates the relationship between clamp voltage and clamp resistance. In FIG. 8, a vertical axis indicates clamp resistance (mJ) and a horizontal axis indicates clamp voltage (V). From the viewpoint of the absolute value of clamp voltage, clamp voltage drops to 3 V by adopting the structure of the semiconductor device 10. Accordingly, clamp resistance j3 at the time of clamp voltage=3 V is higher than clamp resistance j1 or j2 and clamp resistance is improved at a low clamp voltage. Furthermore, clamp voltage is decreased without using the active clamping circuit 2. This ensures durability for high voltage application.

As has been described in the foregoing, according to the present disclosure, the voltage-controlled MOS transistor M3 is located between the gate and the source of the gate charge extracting MOS transistor M2 which extracts gate charges of the output-stage switch M1. The voltage VOUT at the time of a voltage across the L load 3 being cramped is controlled by switching of the voltage-controlled MOS transistor M3. This improves the clamp resistance of the L load 3 by decreasing clamp voltage and realizes a circuit which withstands high voltage application.

The embodiment has been taken as an example. The structure of each section indicated in the embodiment may be replaced by another structure having the same function. Furthermore, any other component or process may be added. Moreover, the structures (features) of any two or more of the above embodiment may be combined.

According to an aspect, clamp resistance is improved by decreasing clamp voltage and durability for high voltage application is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device for operating an inductive load, comprising:

a switching element having a control terminal, a low potential terminal and a high potential terminal, the high potential terminal being configured to receive a positive power supply voltage, the switching element being connected to the inductive load, and being configured to operate in an on state and an off state;

a drive circuit configured to apply a control voltage to the control terminal of the switching element to drive the switching element, and operate the inductive load connected to the switching element;

an extracting circuit configured to extract control terminal charges from the control terminal of the switching element while the switching element makes a transition from the on state to the off state, the extracting circuit including a first metal-oxide-semiconductor (MOS) transistor, which is a MOS transistor located between the control terminal of the switching element and the connection point, and has a control terminal that is connected to the drive circuit; and a voltage control circuit connected to a connection point between the low potential terminal of the switching element and the inductive load, the voltage control circuit being configured to clamp a drop in a voltage at the connection point to a predetermined voltage while the extracting circuit is extracting the control terminal charges.

2. The semiconductor device according to claim 1, wherein:

the voltage control circuit is a second MOS transistor, which is another MOS transistor located between the control terminal of the first MOS transistor and the connection point and functions as a source follower.

3. The semiconductor device according to claim 2, wherein the voltage control circuit is configured to clamp the drop in the voltage at the connection point by stopping extracting the control terminal charges through the first MOS transistor, or by turning on the second MOS transistor to thereby minimize an amount of the control terminal charges extracted by the first MOS transistor.

4. The semiconductor device according to claim 3, wherein:

the first MOS transistor is a first n-channel MOS (NMOS) transistor, and the second MOS transistor is a second NMOS transistor;

a drain of the first NMOS transistor is connected to the control terminal of the switching element;

a drain of the second NMOS transistor is connected to a gate of the first NMOS transistor;

a gate of the second NMOS transistor is connected via a resistor to a reference potential; and a source of the second NMOS transistor is connected to a source of the first NMOS transistor and the connection point.

5. The semiconductor device according to claim 4, wherein the second NMOS transistor is configured to, while the first NMOS transistor is extracting the control terminal charges, turn on at a time when the voltage at the connection point becomes lower than or equal to a voltage differential obtained by subtracting a threshold voltage of the second NMOS transistor from the reference potential, and clamp the voltage at the connection point to the voltage differential.

6. A semiconductor device for operating an inductive load, comprising:

a switching element having a control terminal, a low potential terminal and a high potential terminal, the high potential terminal being configured to receive a positive power supply voltage, the switching element being connected to the inductive load, and being configured to operate in an on state and an off state;

a drive circuit configured to apply a control voltage to the control terminal of the switching element to drive the switching element, and operate the inductive load connected to the switching element;

an extracting circuit configured to extract control terminal charges from the control terminal of the switching element while the switching element makes a transition from the on state to the off state; and a voltage control circuit connected to a connection point between the low potential terminal of the switching element and the inductive load, the voltage control circuit being configured to clamp a drop in a voltage at the connection point to a predetermined voltage while the extracting circuit is extracting the control terminal charges, wherein:

the extracting circuit includes a pull-down resistor connected between the control terminal of the switching element and the connection point; and the pull-down resistor extracts the control terminal charges of the switching element during the clamping.

* * * * *